US 6,531,327 B2

(12) United States Patent
Kanamaru et al.

(10) Patent No.: US 6,531,327 B2
(45) Date of Patent: Mar. 11, 2003

(54) METHOD FOR MANUFACTURING SEMICONDUCTOR DEVICE UTILIZING SEMICONDUCTOR TESTING EQUIPMENT

(75) Inventors: Masatoshi Kanamaru, Miho (JP); Yoshishige Endo, Tsuchiura (JP); Atsushi Hosogane, Iwama (JP); Tatsuya Nagata, Ishioka (JP); Ryuji Kohno, Chiyoda (JP); Hideyuki Aoki, Takasaki (JP); Akihiko Ariga, Musashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/073,343

(22) Filed: Feb. 13, 2002

(65) Prior Publication Data

US 2002/0072136 A1 Jun. 13, 2002

Related U.S. Application Data

(63) Continuation of application No. 09/522,477, filed on Mar. 9, 2000.

(30) Foreign Application Priority Data

Sep. 27, 1999 (JP) .......................................... 11-271804

(51) Int. Cl.[7] .......................... H01L 21/66; G01R 31/26
(52) U.S. Cl. .............................. 438/17; 438/14; 438/18
(58) Field of Search ............................. 29/592.1, 593, 29/874; 324/754, 751, 762; 439/482; 438/14, 17, 18

(56) References Cited

U.S. PATENT DOCUMENTS 5,625,298 A * 4/1997 Hirano et al. ............... 324/754

* cited by examiner

*Primary Examiner*—Kamand Cuneo
*Assistant Examiner*—Asok Kumar Sarkar
(74) *Attorney, Agent, or Firm*—Antonelli, Terry, Stout & Kraus, LLP.

(57) ABSTRACT

A method for manufacturing a semiconductor device includes forming an integrated circuit on a surface of a wafer and testing electric characteristic of the integrated circuit. The testing includes positioning each of probes of a semiconductor testing equipment and each of electrodes of a tested semiconductor element with each other, and allowing each of the probes to come into contact with each of the electrodes. The semiconductor testing equipment includes a first substrate having a cantilever, the probes being formed on the cantilever of the first substrate, and wires for electrically connecting the probes to electrode pads which are formed on an opposite side of the first substrate to a side on which the probes are formed. Each of the wires has a region arranged on an insulating layer, which is formed on the cantilever, on the opposite side.

21 Claims, 13 Drawing Sheets

METHOD FOR MANUFACTURING SEMICONDUCTOR DEVICE UTILIZING SEMICONDUCTOR TESTING EQUIPMENT

CROSS REFERENCE TO RELATED APPLICATION

This is a continuation of U.S. application Ser. No. 09/522,477, filed Mar. 9, 2000, the subject matter of which is incorporated by reference herein.

BACKGROUND OF THE INVENTION

The present invention relates to a method for testing a semiconductor element or device, and more particularly to a method for testing a highly reliable and high-yield semiconductor device and its electric a characteristic by doing an efficient test of the electric characteristic of the semiconductor element in a semiconductor manufacturing process, such as a probing test and a burn-in test to be done for a wafer.

A process of manufacturing a semiconductor such as an IC and an LSI may be generally divided into a first process from the start to the formation of an integrated circuit on the surface of a silicon wafer, and a second process from the end of the first process to the separation of the silicon,wafer into chips and sealing of each chip by resin or ceramics.

In the semiconductor device manufactured in the process, the electric characteristic of each circuit contained in the semiconductor is tested for checking if each chip is defective.

This electric characteristic test may be roughly divided into a probing test for checking if the conduction between the circuits is defective, a burn-in test for acceleratively separating good circuits from defective ones by applying thermal and electric stress onto the circuits at a high temperature of about 150° C., and a final test for testing the circuits through the use of a high frequency. In the final test to be done with the high frequency, it is desirous to use a testing system of fast operation in which the fast device is.tested by means of a super high frequency.

The foregoing various kinds of testing methods just need a similar connecting means between a wafer or a chip to be tested and an external testing system. Concretely, a conductive minute probe is mechanically pressed on an electrode pad made of aluminum alloy or another alloy, the electrode pad being patterned on the wafer to be tested at pitches of several tens to one hundred and several tens micro millimeters, several tens to one hundred and several tens micro millimeters per side, and in thickness of about 1 micro millimeter.

Recently, a system for testing bare chips being formed on a wafer is designed, because some customers are requesting bare chips not to be packaged such as a MCM (Multi Chip Module). The technology of doing a burn-in test for a wafer has been described in JP-A-8-148533. This burn-in test is executed so that spots corresponding to electrode pads of a wafer to be tested are electrically connected with electrode pads of a testing substrate made of silicon through an anisotropic conductive film laid therebetween, and the probes are taken out onto the wafer to be tested through through-holes formed in the testing substrate. The electrical communication with an external equipment is performed through wires.

The testing method of the semiconductor device as mentioned above in the prior arts has the following problems.

At first, each cantilever with a probe formed of a silicon system material is junctioned with the corresponding insulated substrate surface. A troublesome operation is therefore required for positioning and fixing each probe at high precision. It means that this construction has difficulty in narrowing the pitch of the electric pads, thereby possibly lowering a manufacturing yield. Moreover, after each probe is junctioned on the insulated substrate surface, it is presumed that the heights of the probes are so variable that the probes cannot be formed at a constant height. Since the wires led from the probes are routed peripherally, the wires for electrically connecting the tips of the probes with an external testing system are formed on the substantially same level with the probe forming surface of the substrate. This inevitably needs to form all the external connecting terminals concentratively around the outer periphery of the substrate. It means that the area where the external connecting terminals are to be formed is limited. As a result, it becomes difficult to electrically connect lots of probes with the external. This inhibits to test a large area of the wafer to be tested at a time, that is, all the electrode pads of the wafer to be tested at a batch. Further, it is also presumed that the wires are made longer and thereby the measurement with a high frequency is made difficult.

In the conventional construction in which the routing of the wires is formed in the upper portion, the wires are led from the probes through the through holes. However, the wires to the piezoelectric elements are assembled by using plural substrates, so that the conduction is made defective by the positional shift of the wire between the substrates and the manufacturing yield is also made lower.

In the construction disclosed in JP-A-8-148533, the conduction between the electrode pads formed on the testing substrate and those formed on the wafer to be tested is through the anisotropic conductive film. Hence, it is presumed that the test of the device patterned at a narrow pitch is made difficult.

The foregoing prior arts do hot consider the electrostatic capacity of the silicon. It means that the test of the fast device of 200 MHz or higher is made substantially impossible. In particular, the prior arts are constructed so that the through holes are formed in the silicon substrate. Thereby, this construction has difficulty in forming an insulating film to be thick on the side of the each through hole, and increases the electrostatic capacity of the silicon. As a result, it is unable to do the test with a high frequency. In the conventional system, the matching of the impedance of the wires is not done. This makes it impossible to test a fast semiconductor element or device. It means the conventional system cannot cope with the fast semiconductor.

SUMMARY OF THE INVENTION

It is an object of the present invention to provide an equipment for testing an electric characteristic of a semiconductor device which is constructed to solve the foregoing problems and enable the test of a large area to be done, that is, test all the electrode pads of the wafer to be tested at a batch, thereby improving the manufacturing yield and reducing the manufacturing cost, by which method the inexpensive and highly reliable semiconductor device can be manufactured.

It is a further object of the present invention to provide a semiconductor testing equipment which is constructed to test a diversity of semiconductor elements or devices from a slow to a fast ones.

In order to achieve the objects, in a testing equipment for testing a semiconductor element by keeping an electrical connection between a plurality of electrode pads, which are formed on a semiconductor element to be tested, and probes which are formed on a first substrate made of silicon among a plurality of electric-connecting substrates located in the testing equipment, the probes are formed on a cantilever in the first substrate, and a wire is continuously connected from a tip of the probe to the electrode pad formed on an opposite side to a probe forming surface along a tip portion of the cantilever through an insulating layer.

In particular, in the first substrate having the probes formed thereon, a ground layer made of metal is formed within the first substrate, and a plurality of wires are formed on a surface of the ground layer through the insulating layer. A power line and a ground line of those wires are formed to be thicker than signal lines, and electrically connected with the ground layer near the electrode pad. The signal lines are electrically connected with the ground layer nearby the probe. Moreover, the thickness of the insulating layer may be preferably formed in the range of 3 $\mu$m to 30 $\mu$m.

Further, the first substrate is formed of low-resistive silicon, and a plurality of wires are formed on the surface of the first substrate through the insulating layer. The power line and the ground line of those wires are formed to be thicker than the signal lines, and are electrically conducted with the low-resistive silicon layer nearby the electrode pad. The signal lines are electrically conducted with the low-resistive silicon layer nearby the probe.

The insulating layer is formed of a first insulating film and a second insulating film. The first insulating film is formed of a thermal-oxidative film made of silicon dioxide, and the second insulating film is formed by a sputtering device or a CVD device or spin-coating or screen-printing an organic insulating material such as polyimide resin.

Further, the thickness of the first insulating film is 3 $\mu$m or lower and the overall thickness of the first and the second insulating films is in the range of 3 $\mu$m to 30 $\mu$m. Moreover, through the use of the foregoing structure and system, the testing equipment enables to test the fast device and thereby provides a quite inexpensive semiconductor element or electronic component to be tested.

DESCRIPTION OF THE EMBODIMENTS

Figure 1:
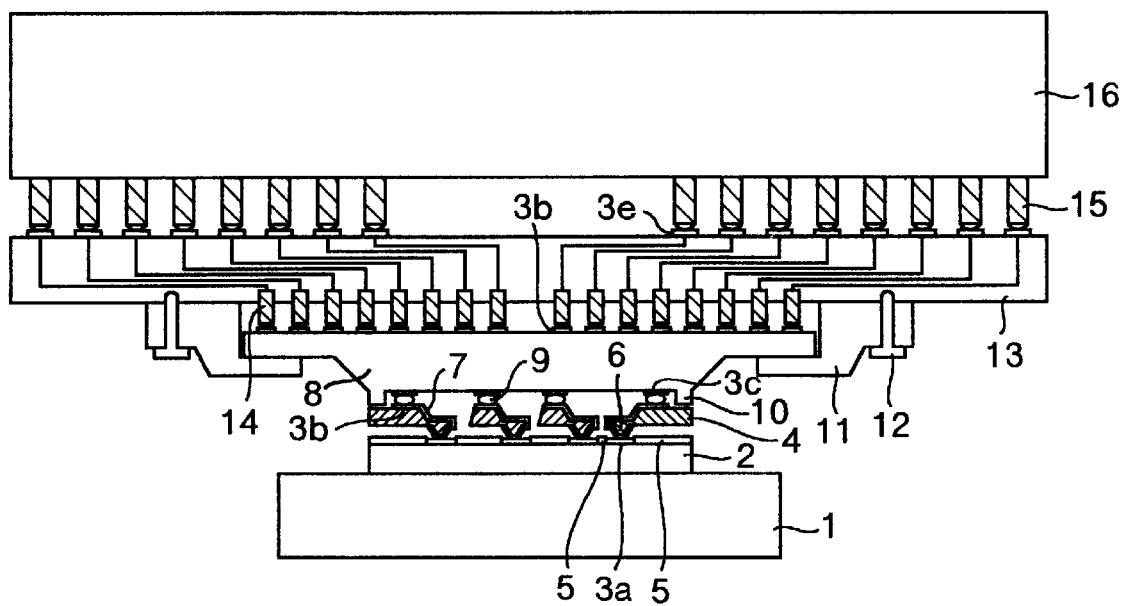
FIG. 1 is a side view showing a semiconductor testing equipment according to an embodiment of the present invention.

The description will be expanded about the embodiments of the present invention with reference to FIGS. 1–19. FIG. 1 shows the structure of a wafer batch testing equipment according to an embodiment of the present invention.

As shown in FIG. 1, the wafer batch testing equipment is constructed so that an easily transformable cantilever is formed on a probe forming substrate 4 and a probe 6 is formed at the tip of the cantilever or near it. On the probe forming substrate 4, a metallic wire 7 is led from the probe 6 to an electrode pad portion 3b formed on the opposite side to a probe forming surface, along the tip portion of the cantilever through an insulating layer. The probe forming substrate 4 will be discussed below in detail.

The probe forming substrate 4 is fixed on an electric connecting substrate 8 by solder balls 9. In this embodiment, the solder balls are served to fix the probe forming substrate 4 and to electrically connect between them. As another method of the fixation and the electric connection, it is possible to select the method of forming silver paste, platinum paste, a metallic material insoluble at a temperature of 150° C. or lower, and a compound material by means of the screen printing and to sinter the material, for the purpose of doing the electric conduction and fixation.

The multi-layered wire is formed inside of the electric connecting substrate 8. This multi-layered wire serves to widen the interval between the adjacent electrode pads 3c located at a narrow pitch to an interval between adjacent spring probes 14 provided on the multi-wired substrate 13 located on top of the electric connecting substrate 8. The electrode pads 3c formed on the electric connecting substrate 8 are formed in a matrix manner and at a pitch of 800 $\mu$m. The electric connecting substrate 8 may preferably employ ceramics as the material, in particular, mullite in light of a coefficient of linear expansion. It has a closer coefficient of linear expansion to the silicon, because the burn-in test of various tests is executed at the temperature of 150° C. and thereby the probe and the electrode pad of the to-be-tested wafer made of silicon are not positionally slipped from each other.

Further, in order to protect the solder balls 9 from being crushed up to a certain extent by the pressure applied in the test, projections 10 for preventing buckling are formed around the probe-formed side of the electric connecting substrate 8. In assembly, a given gap is provided between each projection and the probe forming substrate 4. The size of the projection 10 is formed to be about 20% of the size (height) of the solder ball 9.

The electric connecting substrate 8 and the probe forming substrate 4 are fixed onto the multi-layered wire substrate 13 with bolts 12 by means of a jig 11. The jig 11 may use as its material a less thermally transformable material at the temperature of 150° C. or higher, for example, aluminum nitride or Invar. The inside of the multi-layered wire substrate 13 is structured to have a multi-layered wire on a glass epoxy material, which are connected to the inside multi-layered wire in which lots of spring probes 14 are formed. The spring probe 14 is an electric conductive terminal provided with a spring mechanism. Like the foregoing electric connecting substrate 8, this multi-layered wire substrate 13 provides a function of enlarging the wiring pitch from the side opposed to the electric connecting substrate 8 to the opposite side thereto. In a wafer batch testing section 16, the spring probes or the connecting pins 15 used for electrically conducting with the multi-layered wire substrate 13 are provided at a pitch of the electrode pads 3e of the multi-layered wire substrate 13.

As described above, two substrates, that is, the electric connecting substrate and the multi-layered wiring substrate, are located between the probe forming substrate and the wafer batch testing equipment. The ground of the two substrates located therebetween will be described as follows. The electric wiring substrate is structured to have the multi-layered wires formed in the ceramics. This structure cannot be easily manufactured and needs a high manufacturing cost though it may offer highly accurate wiring layers. It means that the substrate cannot be changed easily. In changing the testing system or contacts, therefore, the multi-layered wiring substrate may be used which is manufactured more easily and inexpensively. Further, the application of those substrates to another testing equipment may be made easier because only the exchange of the multi-layered wiring substrate, which may be manufactured more inexpensively and easily, is needed.

Hence, the test can be executed merely by connecting the electric connecting substrate 8 and the testing section 16 with the spring probes located on the testing section 16 without having to use the multi-layered wiring substrate 13.

The wafer 2 to be tested is fixed on a fixing stage 1 through a vacuum chuck. The fixing stage 1 is structured to adjust its height in steps of several hundreds $\mu$m and the pressure in steps of several grams and to be moved vertically, horizontally and peripherally. The electrode pad 3a formed on the wafer 2 is allowed to come into contact with the probe 6 provided on the probe forming substrate 4 as the pad 3a and the probe 6 are being positioned with each other quite accurately. The foregoing structure provides a moving function for positioning on the side of the fixing stage. The present invention is not limited to this structure. In place, the moving function for positioning may be added to both the probe forming substrate or the probe forming substrate and the fixing stage.

In turn, the description will be oriented to the structure of the electric conducting means for sending and receiving an electric signal, located between the wafer batch testing section 16 and the wafer 2 to be tested. After the positioning of the electrode 3a of the wafer 2 with the probe 6 of the probe forming substrate 4 is terminated, both the electrode 3a and the probe 6 come into contact with each other through the use of the foregoing mechanism (the stage on the side of the wafer 2 is raised so that it may come into contact with the probe 6). Then, the probe forming substrate 4 is pressed onto the wafer 2 to such an extent as keeping the substrate 4 out of contact with the surface protective film 5. In this action, the warp and the inclination of the wafer to be rested are suppressed, the cantilever of the probe forming substrate is warped upwardly, and a certain amount of pressure is applied onto the electrode pad 3a by the reaction against the warp.

In this embodiment, the pressure required for electric conduction is about 3 grams. More pressure may offer excellent electric conduction. Too large pressure, however, may damage the electrode pad 3a. In addition, the wafer 2 to be tested includes the electrode pad 3a made of aluminum and formed about 100 $\mu$m per side. The surface protective film 5 made of polyimide resin is formed on the periphery of the electrode pad 3a in order to prevent the defective contact.

On the wires except the electrode pad 3b and the probe 6 of the probe forming substrate 4, the insulating film made of polyimide is formed so that the film may fill up a wire step. The insulating film coated on the surface of the probe.forming substrate 4 may use any insulating material only if the material does not impair the surface protective film 5 of the wafer 2 and can withstand the temperature of 150° C. or more. The wires may have the structure.wherein the wires are filled in the grooves formed in the probe forming substrate.

The electrode pad 3a is made electrically conductive by making the electrode pad 3a contact with the probe 6 of the probe forming substrate 4. The metallic wire is formed in a route from the probe 6 of the probe forming substrate 4 to the electrode pad 3b formed on the opposite side to the probe-formed side. The electrode pad 3b of the probe forming substrate 4 and the electrode pad 3c located on the lower surface of the electric connecting substrate 8 are electrically connected by the solder balls. The electrode pads 3c and 3d located on the lower and the upper surfaces of the electric connecting substrate 8 are electrically connected through the multi-layered wires formed inside of the electric connecting substrate. The electric transfer between the electrode pad 3d located on the upper surface of the electric connecting substrate 8 and the multi-layered wiring substrate 13 is executed through the use of the spring probe 14 formed on the multi-layered wiring substrate 13.

The spring probe 14 may reliably offer the electric connection even in case the substrate is wound without bringing about any defective conduction, by virtue of its spring mechanism. The use of the spring probe makes it possible to easily exchange the lower portion from the electric connecting substrate 8 even when changing an object to be tested. The spring probe 14 is connected to the electrode pad 3e formed on the top of the multi-layered wiring substrate 13 through the internal wires. Further, the final electric transfer between the electric connecting substrate 13 and the wafer batch testing section 16 is executed through the use of the spring probes 14 or the connecting terminals 15 formed on the testing section 16.

The use of various substrates located as described above makes it possible to transfer an electric signal between the electrode pad 3a of the wafer 2 to be tested and the testing equipment. Further, the lower portion from the electric connecting substrate 8 may be easily replaced according to the test type. Hence, the present testing equipment may apply to various kinds of testing methods to be discussed below.

The electric characteristic test of a semiconductor element or a semiconductor device comprises a probing test for determining whether or not the conduction between the circuits is good at a driving frequency of basically 30 MHz, a burn-in test for applying thermal and electric stress onto the circuit for several to several tens hours, at a high temperature of 150° C. and a driving frequency of 5 MHz and acceleratively selecting the bad circuits, and a final test for testing the circuit at a high frequency of 133 MHz or more. Basically, the semiconductor element or device may be selected according to each driving frequency.

Moreover, some LSI chips such as a run-bus DRAM may be tested at a driving frequency of 400 MHz or more or another LSI chips may be tested at a driving frequency of 1 GHz or more. The electric characteristic tests are continuously executed on the wafer. The testing equipment according to the present invention, therefore, makes it possible to make the probe forming substrate located in the testing equipment keep the probes into excellent contact with the electrode pads of the chip to be tested at a high temperature of 150° C. and be electrically operated at a fast speed.

Figure 2:
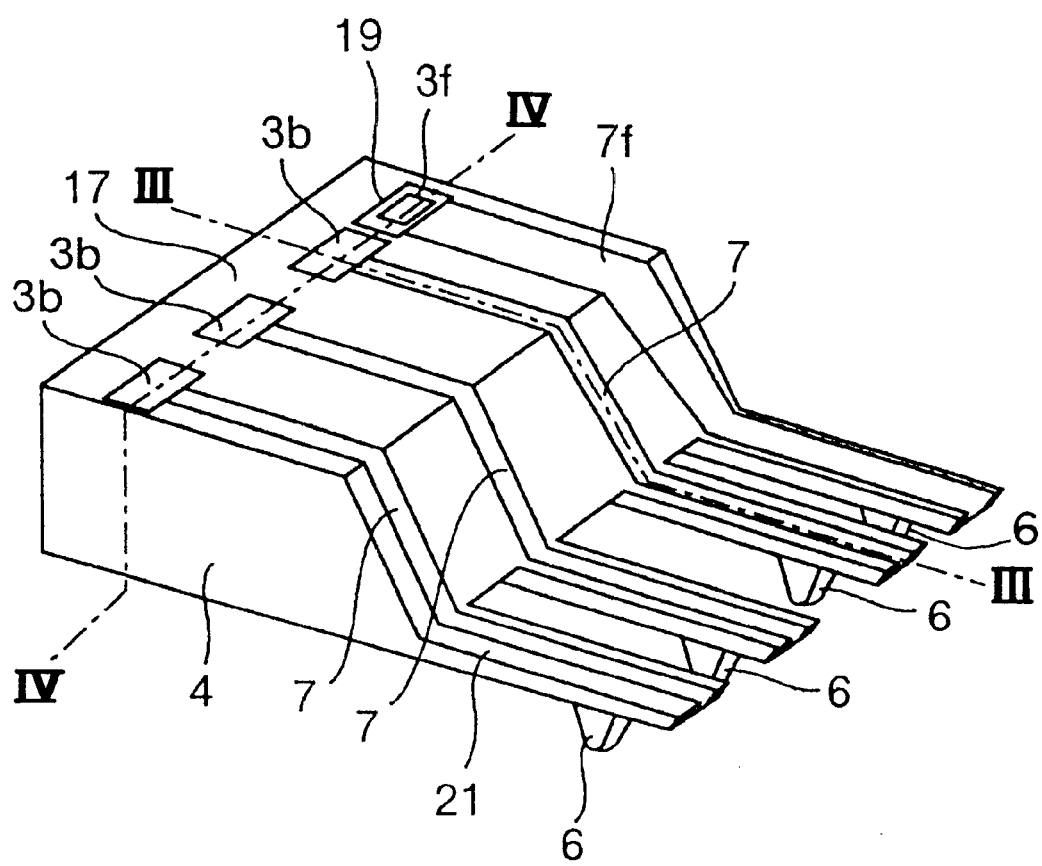
FIG. 2 is a perspective view showing the semiconductor testing equipment according to the embodiment of the present invention.

In turn, the description will be oriented to the detailed structure of the probe forming substrate 4 with reference to FIGS. 2–7. FIG. 2 shows an outer appearance of the probe forming substrate.

The probe forming substrate 4 of the embodiment is made of a silicon material, and a cantilever 21 and a probe 6 on one side of the tip portion of the cantilever 21 are formed using the micro machining technique. The probe 6 may be positioned at the same site as the electrode pad of the wafer to be tested. The silicon probe of the embodiment is positioned accurately on the wafer because the silicon wafer is worked using the micro machining technique. The positioning accuracy depends on the mask accuracy. The general mask accuracy is equal to or lower than ±1 μm, which covers the relative positioning accuracy of the probe to be worked.

The wires 7 and 7f are connected from the electrode pads 3b and 3f to the probe 6. Under the electrode pad and the wires are located a thick insulating layer 17 for preventing the conduction between the wires. The electrode pad 3f includes a metallic layer 19 for connecting with the ground line, formed under the pad itself (see FIG. 4). The wire 7f indicates a power line or a ground line, which is (about 30 to 50 times) thicker in width than the other three wires 7 (signal lines). The test frequency for the signal lines are restricted by the electrostatic capacity. Hence, the width of the signal line may not be made so wider. However, since the power line or the ground line is connected with the ground layer, those lines have no dependency on the electrostatic capacity, so that their widths may be made wider.

Figure 3:
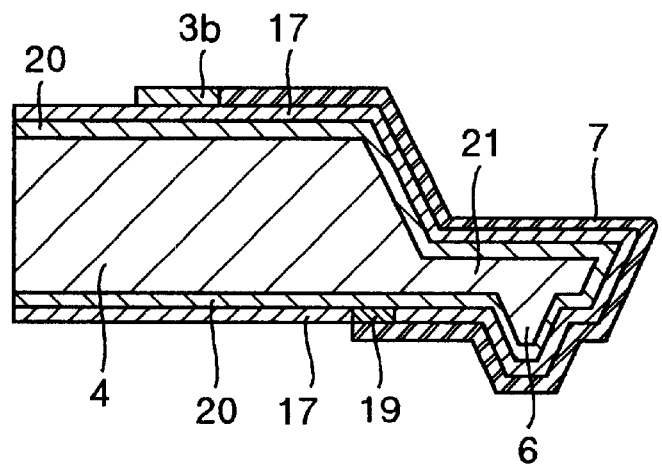
FIG. 3 is a sectional view of a probe and an electrode pad according to the embodiment of the present invention.

FIG. 3 is a sectional view of an III–III broken line 10 of FIG. 2.

The surface of the probe forming substrate 4 made of a silicon material is covered by the ground layer 20. The ground layer may use any metal if it has a small electric resistance. In actual, copper is preferable because it has a low resistance. The insulating layer 17 is formed on the surface of the ground layer 20, on which the wire is formed from the probe 6 to the electrode pad 3b through the tip portion of the cantilever 21. The silicon material may have any resistivity. Preferably, it should have a higher resistance than 0.05Ωcm. This is because if the silicon material is worked using the anisotropic etching of the micro machining technology, the dopants of boron serve to reduce the etching speed and to increase the amount of deformation, thereby giving an adverse effect on the working accuracy.

Further, the signal line is structured to be electrically connected with the ground layer near the probe. It is preferable to form the insulating layer in thickness of 3 to 30 μm. In particular, the thickness of the insulating layer should be about 25/Am for fast testing.

Figure 4:
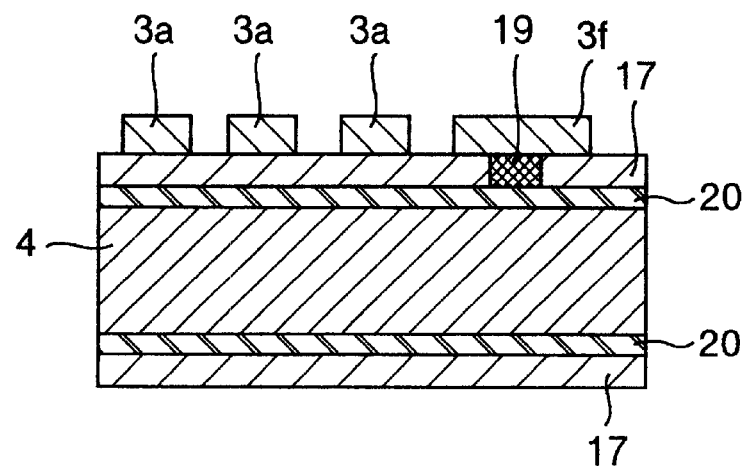
FIG. 4 is a sectional view of the probe and the electrode pad according to the embodiment of the present invention.

FIG. 4 is a sectional view of a IV–IV broken line of FIG. 2.

The ground layer 20 is formed on the probe-formed surface and the opposite surface of the silicon material used for making the probe forming substrate 4. The surface of the ground layer 20 includes the insulating film 17 coated thereon, on the surface of which the electrode pads 3b and 3f are formed. The electrode pad 3f is a power line or ground line and thus is structured to be connected to the ground layer through the metallic layer 19.

In the foregoing structure, the power line and the ground line of the wires are electrically connected with the ground layer around the electrode pad, while the signal lines are electrically connected with the ground layer around the probe. This structure makes it possible to lower the noises and do a fast test with a high frequency. Further, in the case of applying the structure wherein the ground line and the signal lines are not connected with the ground layer, if current is flown through the wires, the induced current is flown in the ground layer so as to cancel the current. It means that the inductance in this structure is made about half as large as that in the absence of the ground layer because of the influence given by eddy current. In some tests, therefore, this type of structure may be applied according to the testing condition.

Figure 5:
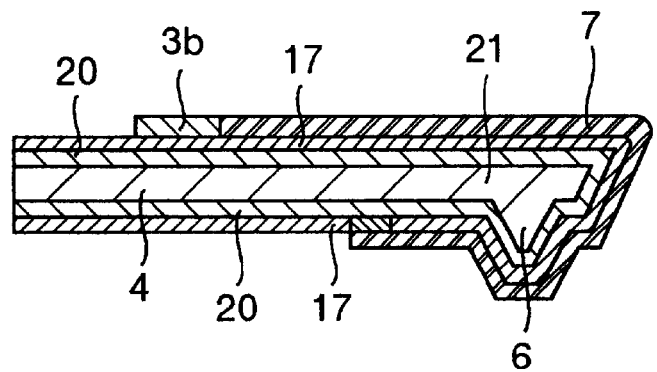
FIG. 5 is a sectional view of a probe and an electrode pad according to another embodiment of the present invention.

In the embodiment, the cantilever is deflected to an extent of about 10 μm so as to come into contact with the electrode pad of the wafer to be tested. As shown in FIG. 5, therefore, the same thickness of the silicon wafer as the cantilever 21 may be used for making the probe forming substrate 4. This structure allows the displacement 10 μm of the cantilever to be absorbed by the gap of the solder ball having a diameter of 250 μm for fixing the probe forming substrate 4 onto the electric connecting substrate 8.

Figure 6:
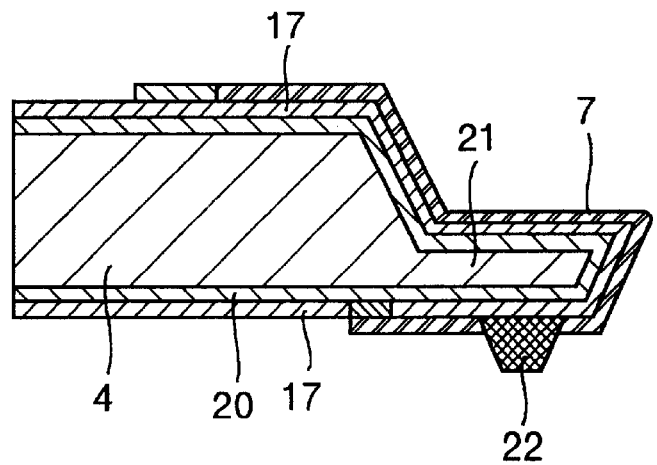
FIG. 6 is a sectional view of a probe and an electrode pad according to further another embodiment of the present invention.

Further, it is preferable to form the probe of a silicon material in light of reliability. As shown in FIG. 6, after the ground layer 20 and the insulating layer 17 are formed on the cantilever 21, the metallic probe 22 may be formed. In this case, the probe 22 may use the same material as the material of the wires or the different metal. It is preferable that the metallic probe may be made of a low-resistive and hard material. The material except the metal may be applied to the formation of the probe if the condition is met.

As in the foregoing structure, the insulating film 17 is formed under the plurality of wires 7, under which the ground layer 20 is formed. The power line or the ground line is connected with the ground layer close to the electrode pad and the signal lines are connected with the ground layer close to the probe. This structure makes it possible to eliminate the adverse effect given by the noise, reduce the inductance, and match the impedance of the wires to that of the measuring system.

The testing equipment constructed to use the probe forming substrate according to the present invention serves to prevent the influence of the signal of each wire onto the adjacent wire. The matching of the impedance between the wires and the measuring system makes it possible to do a fast test at a high frequency.

Another embodiment of the present invention about the structure of the probe forming substrate will be described with reference to FIG. 7. Like FIG. 3, FIG. 7 shows a sectional view of the probe forming substrate provided if the signal line is applied to the wire.

On the surface of the probe forming substrate 4 is formed a thermal oxidative film 23 made of silicon dioxide. An insulating layer 18 is formed on the surface of the electrode pad 3b and the slope to the cantilever. On the surface of the insulating layer 18 is formed a wire 7 leading from the probe 6 to the electrode pad 3b through the tip portion of the cantilever 21. The wire near the probe 6 is connected to the ground layer 20 through the metallic layer 19.

The use of a low resistive silicon wafer for the probe forming substrate 4 does not need to form the ground layer, so that the probe forming substrate itself is served as the ground layer. In place, it is possible to use the system of lowering the resistance of the surface by doping boron on the overall surface of the structure after forming the structure of the cantilever 21 and the probe 6.

Figure 7:
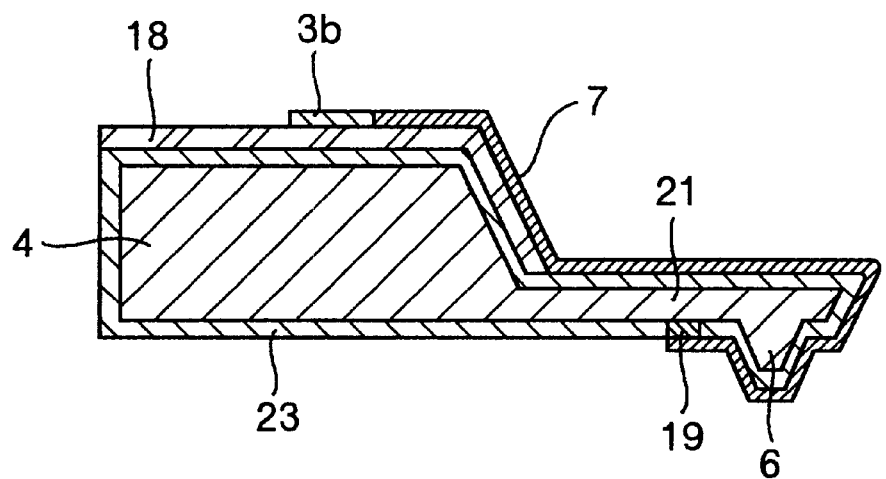
FIG. 7 is a sectional view of a probe and an electrode pad according to yet another embodiment of the present invention.

In the sectional structure shown in FIG. 7, the insulating layer may be the same layer as shown in FIG. 3. In place, it may be composed of two insulating films. By thermally oxidizing the silicon surface, the insulating film (thermal oxidation film) may be easily formed along the form of the structure. However, the insulating layer located under the wire needs to have a thickness of 5 $\mu$m to 30 $\mu$m. Hence, the thermal oxidation film 23 may be thicker. However, the speed of forming the thermal oxidation film is likely to be slow in inverse proportional to time. It takes about 27 hours to form the thermal oxidation film having a thickness of 4 $\mu$m using the wet thermal oxidizing method needs about 27 hours. Hence, in place of the thermal oxidation film, the insulating film 18 may be formed.

In the structure shown in FIG. 7, after the thermal oxidation film 23 is formed to have a thickness of 3 $\mu$m, the insulating film 18 is formed on the thermal oxidation film 23 so that the film 18 may have a thickness of 22 $\mu$m. In particular, the insulating layer is formed on the surface of the electrode pad and the slope. This is because the wire located in the cantilever is air-insulated. The silicon material should have a lower resistance than 0.01 $\Omega$cm. Further, it is preferable to use the polyimide resin for the insulating film 18. Moreover, it is also preferable to keep the thickness of the thermal oxidation film 4 $\mu$m or lower and the thickness of the thermal oxidation film and the insulating film 3 $\mu$m to 30 $\mu$m.

The foregoing structure makes it possible to eliminate the noise and reduce the inductance, thereby matching the impedance of the wires to that of the measuring system. The testing equipment constructed to use the probe forming substrate according to the present invention enables to prevent the influence of the signal of each wire on the adjacent wire. The matching of the impedance between the wires and the measuring system makes it possible to do a fast test with a high frequency.

In order to test at a batch a wafer to be tested, the probe forming substrate 4 needs to take the necessary electrode pads in the range of one chip area of the wafer. This is because in the case of taking the electrode pads from a larger area of one chip, the positions of the electrode pads are widened from the center to the outer periphery, resulting in making the length of the wire longer as the wire is closer to the outer periphery. Hence, the length of the wire and the electrostatic capacity of an overall signal line are made variable in respective chips, thereby causing to lower the driving frequency and making the test less reliable.

Further, in the case of doing various tests, the required number of pads are changed according to the tests. In order to perform various tests in the wafer, it is necessary to produce the same number of probes and electrode pads as the electrode pads of one chip of the wafer on the probe forming substrate. In actual, however, it is necessary to form about 80 probes and electrode pads over an area of about 40 mm$^2$.

Figure 8:
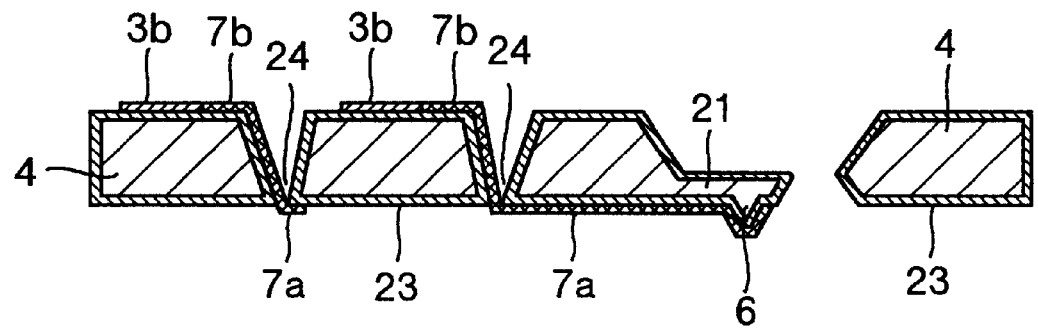
FIG. 8 is a sectional view of a through hole for a wire formed in a probe forming substrate.
Figure 9:
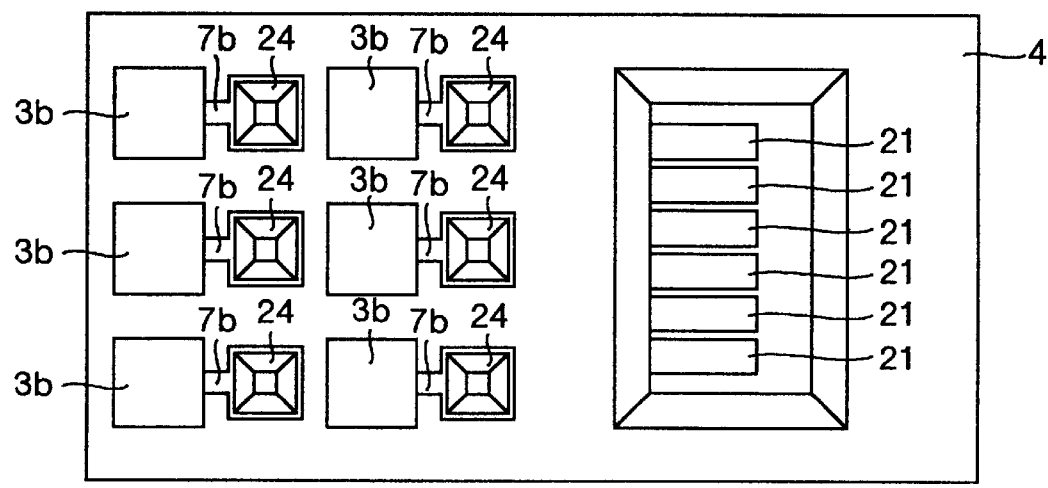
FIG. 9 is a plan view of FIG. 8.
Figure 10:
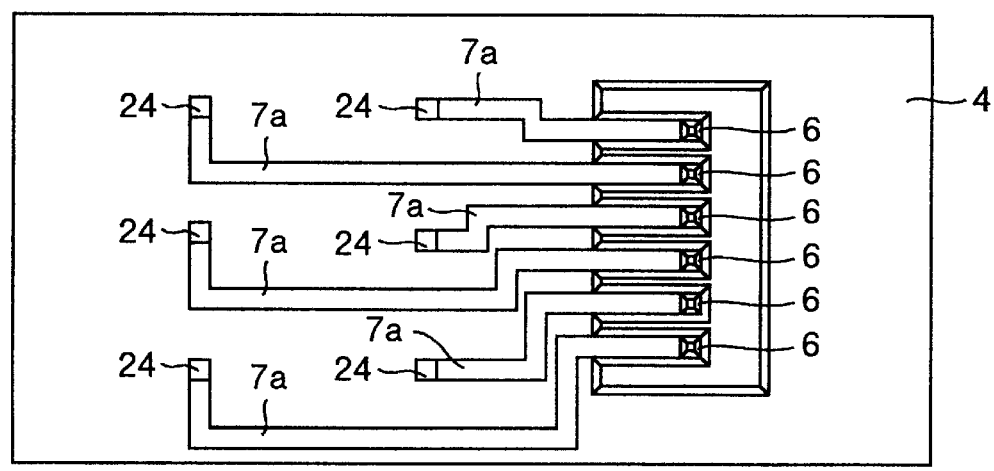
FIG. 10 is a plan view from the probe side of FIG. 8.

Hence, the positions of the electrode pads will be described with reference to FIGS. 8–13. FIG. 8 is a sectional view showing a structure in which through holes are opened in part of the probe forming substrate for forming wires. FIG. 9 is a plan view from the electrode pad side of FIG. 8. FIG. 10 is an elevation view from the probe side.

In FIG. 8, the probe 6, the cantilever 21 and the through holes 24 are formed in the probe forming substrate 4. The wires 7a and 7b are formed on the thermal oxidation film 23 and are led from the probe 6 to the electrode pad 3b through the through hole.

As shown in FIGS. 9 and 10, the wire 7a is connected from a plurality of probes 6 formed on the cantilever 21 of the probe forming substrate 4 to the electrode pad 3b via the through hole 24 and the wire 7b. The electrode pad 3b is positioned so that it is kept out of the through hole 36. Hence, the distance between the probe and the electrode pad is made longer.

In this structure, the size W of one side of the opening on the electrode pad side of the through hole 24 may be represented by the following expression:

$$W=H+(2T//2^{1/2})$$

wherein T denotes a thickness of the probe forming substrate and H denotes a size of the opening on the probe side.

For example, if the size of the opening on the probe side is 50 $\mu$m in the silicon wafer having a thickness of 500 $\mu$m, the size of one side in the opening of the electrode pad side of the through hole 24 is made to be 757 $\mu$m, and the area is 0.57 mm$^2$. In order to form 80 electrode pads, only the area of the through hole reaches 45.6 mm$^2$. Hence, it is difficult to form the through hole and the electrode pad substantially at a time.

Figure 11:
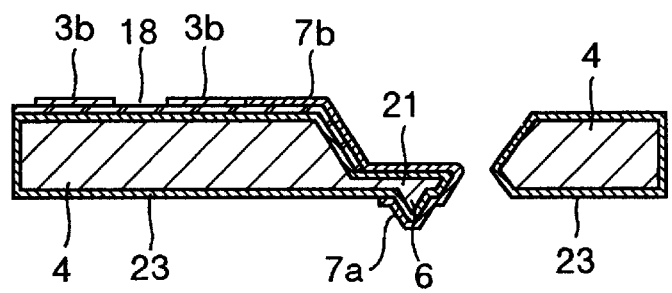
FIG. 11 is a sectional view showing the same according to an embodiment of the present invention.
Figure 12:
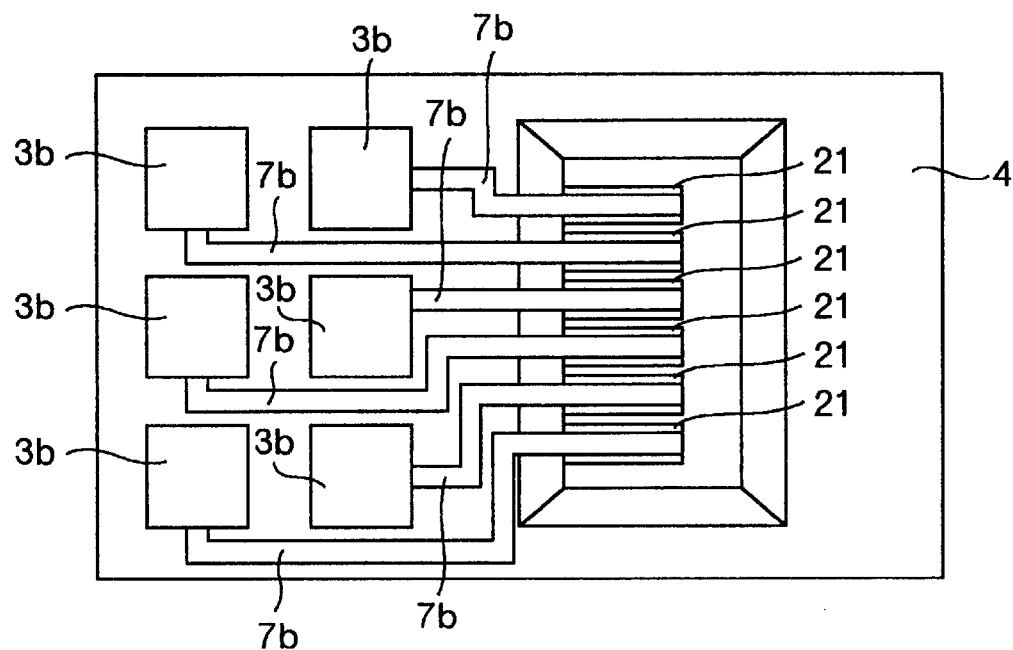
FIG. 12 is a plan view of FIG. 11.
Figure 13:
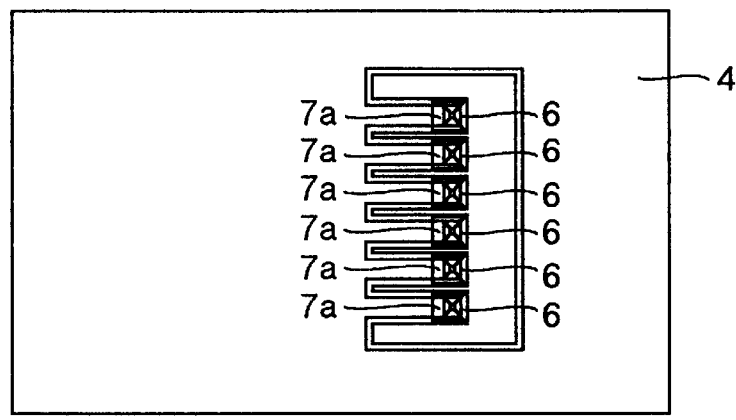
FIG. 13 is a plan view of FIG. 11.

In turn, the description will be oriented to the most approximate position of the electrode pad. The section of the structure worked on the probe forming substrate by the silicon anisotropic etching is shown in FIG. 11. The plan view from the electrode pad of FIG. 11 is shown in FIG. 12. The elevation from the probe side is shown in FIG. 13. As shown in FIG. 11, the probe 6 and the cantilever 21 are worked on the probe forming substrate 4. The wires 7a and 7b are formed on the thermal oxidation film 23 and the insulating film 18 and are connected from the probe 6 to the electrode pad 3b through the cantilever.

In particular, it will be understood from FIGS. 12 and 13 that the wire 7a is led from a plurality of probes 6 formed on the cantilever 21 of the probe forming substrate 4 to the electrode pad 3b through the tip portion of the cantilever by means of the wire 7b. Unlike the foregoing structure, this structure does not need to locate the electrode pad in avoidance of the through hole, which makes it possible to form far more electrode pads on a small area. Hence, the distance between the probe and the electrode pad is made shorter and thus the electrostatic capacity is made smaller accordingly, thereby allowing the fast operation. Further, the absence of the through hole serves to improve the strength of the probe forming substrate.

Figure 14:
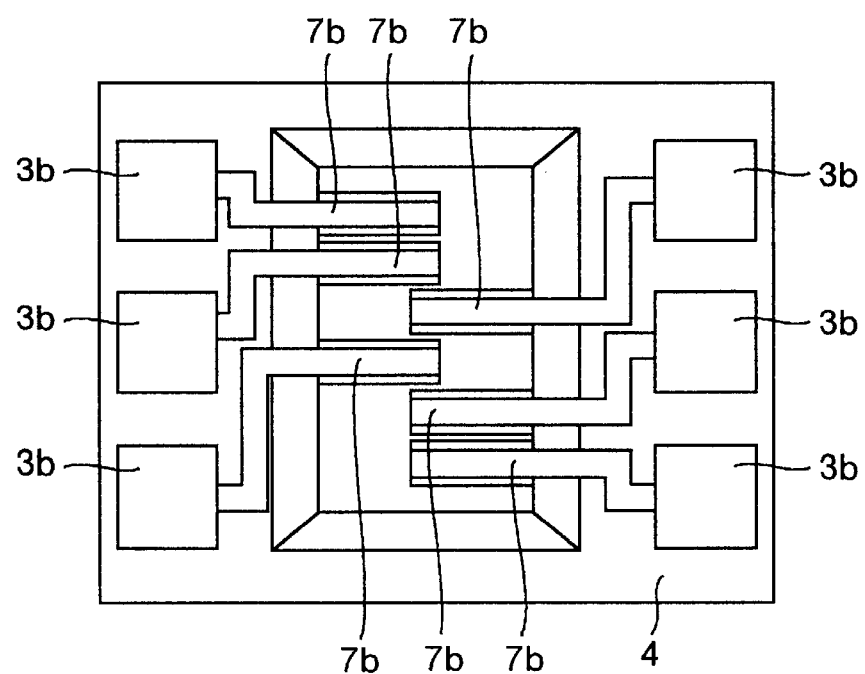
FIG. 14 is a plan view of a semiconductor testing equipment according to another embodiment of the present invention.

The structure made to reduce the disposition area of the electrode pads is shown in FIG. 14. As shown, this structure is arranged to layout the same number of electrode pads 3b symmetrically on the probe forming substrate 4, locate the cantilever in combination with those electrode pads, and make the wires 7b staggered, for the purpose of reducing the disposition area of the electrode pads.

Figure 15:
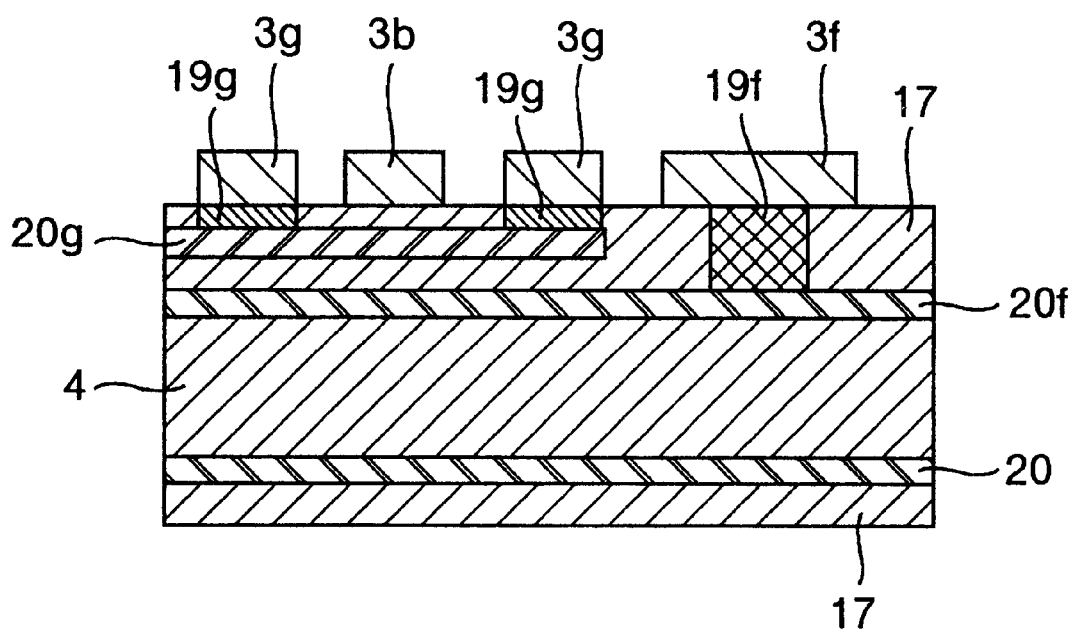
FIG. 15 is a sectional view of the semiconductor testing equipment according to another embodiment of the present invention.

Since no through hole for wiring is formed, the electrode pad surface is made leveled, which makes it easy to form the multi-layered wiring structure. In the case of forming the multi-layered wiring in the probe forming substrate having through holes formed by the anisotropic etching described above or vertical holes, the necessary holes are required to be connected with each other by the wires. Hence, the working process is so sophisticated that it needs high accuracy. On the other hand, in the case of forming the multi-layered wiring in the probe forming substrate according to the present invention, it is just necessary to connect the necessary electrode pads with the conductive layer formed on the substrate surface. Hence, the working process is not so sophisticated that it does not need so high accuracy. One example is shown in FIG. 15. FIG. 15 is a sectional view showing the multi-layered wiring according to the present invention. Inside of the probe forming substrate 4 are formed ground layers 20f and 20g. The electrode pad 3f indicates an electrode pad for a ground line. The electrode pad 3g indicates an electrode pad for a power line. The electrode pad 3b indicates an electrode pad for a signal line. The electrode pad 3f is connected to the ground layer 20f by means of a metallic layer 19f. The electrode pad 3g is connected to the ground layer 20g by means of a metallic layer 19g. The connection of the ground line and the power line to the corresponding ground layers makes it possible to do the fast operation.

In turn, the description will be oriented to the working process of forming the probe forming substrate 4 using the micro machining technology. FIG. 16 shows the working process of the structure FIGS. 17 and 18 shows the working process of the wires.

Figure 16A:
FIGS. 16A–16G are views showing an outer appearance of another embodiment of the present invention.

As shown in FIG. 16A, at first, a silicon wafer 26 in thickness of 500 $\mu$m and (100) direction is prepared. Next, a thermal oxidation film in thickness of 0.5 $\mu$m is formed on the silicon wafer. Then, using the photolithography, the series of processes of resist coating, pattern exposure, developing, and etching of thermal oxidation film are executed on the thermal oxidation film 23 formed on the surface of the silicon wafer 26, for forming a mask pattern for a probe 6. In order to obtain the target tip shape of the probe, a compensation pattern is formed on the mask pattern in order to cope with a corner defect caused by the etching.

Figure 16B:
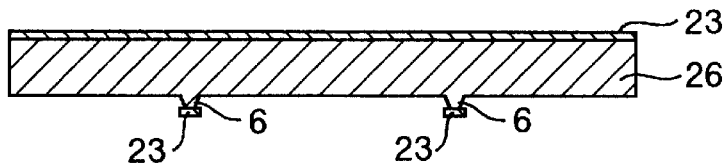

Then, in order to form a step of 20 $\mu$m, one side of the silicon wafer is subject to the anisotropic etching by means of potassium hydroxide solution at the temperature of 65° C. As a result, the probe 6 is formed as shown in FIG. 16B. At this time, a slope is formed on the probe forming section, which slope indicates a (111) plane. The etching speed is slower in this plane than the other crystalline plane. For etching the silicon wafer, in place of the potassium hydroxide solution, another wet etching solution may be used such as ethylene diamine pyrocatechol, tetramethyl ammonium hydro oxide, and hydrazine.

Figure 16C:
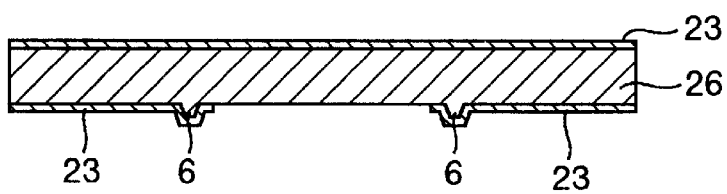

Further, as shown in FIG. 16C, in order to isolate the probe 6, one side of the silicon wafer is subject to the series of processes of resist coating, pattern exposure, developing and etching of a thermal oxidation film using the photolithoprocess on the portion except a beam. The process results in forming the beam pattern composed of the thermal oxidation film 23.

Figure 16D:
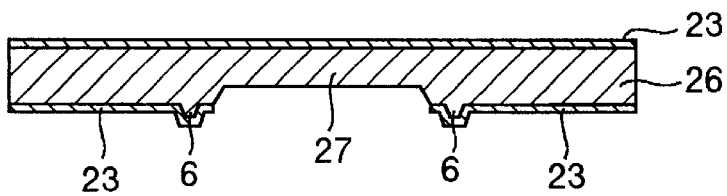

Then, as shown in FIG. 16D, the silicon wafer is etched to a beam thickness using the anisotropic etching, for forming a bottom surface 27.

Figure 16E:
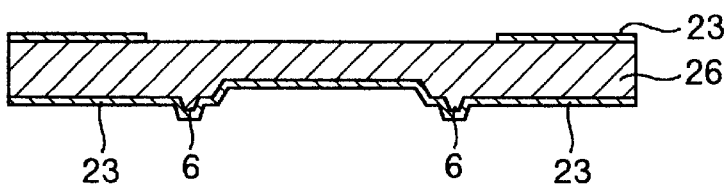
Figure 16F:
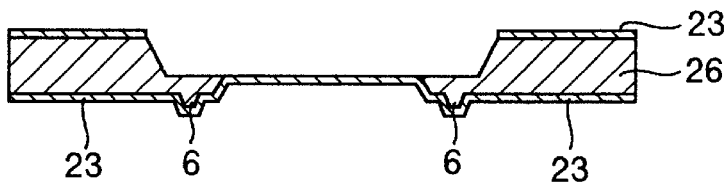

Using the working process as described above, the thermal oxidation film is reformed. Then, as shown in FIG. 16E, the thermal oxidation film 23 formed on the rear side of the probe is worked in a pattern manner. Then, as shown in FIG. 16F, the silicon wafer is etched only to the beam thickness using the anisotropic etching. At this time, since the probe 6 is protected by the thermal oxidation film 23, the shape of the probe is held. Moreover, by adjusting the etching amount, it is possible to control the thickness of the finally left beam.

Figure 16G:
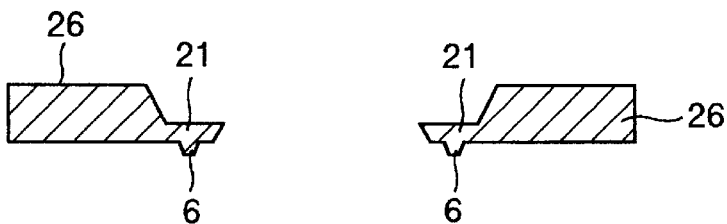

At last, the thermal oxidation film is removed. Then, as shown in FIG. 16G, the structure in which the probes 6 and the cantilever 21 are worked is completed. The working technology has been expanded with reference to the thermal oxidation film formed as a mask material for the anisotropic etching. In place, a silicon nitride film or a compound film composed of a thin thermal oxidation film and the silicon nitride film formed thereon may be used as the mask material. Further, according to the present invention, the etching work of the substrate is not limited to the anisotropic etching work. It may be done by some dry etching devices such as the RIE (Reactive Ion Etching) device and the ion milling device in combination.

Figure 17A:
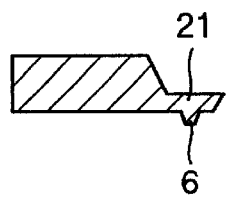
FIGS. 17A–17F are views showing a manufacturing process of a structure according to an embodiment of the present invention.
Figure 17A:
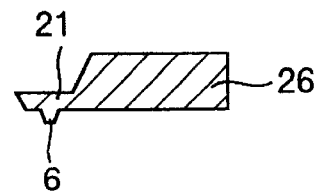
Figure 17B:
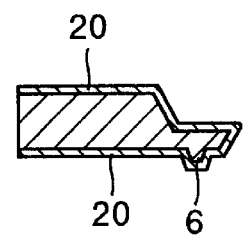
Figure 17B:
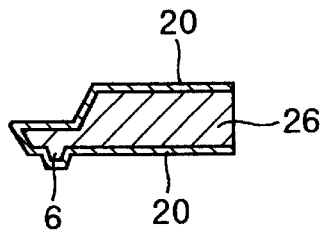
Figure 17C:
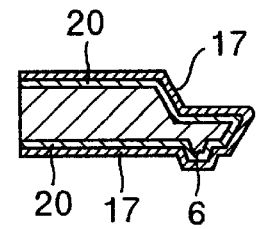
Figure 17C:
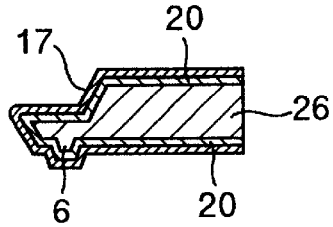

Next, the working process of the wires will be described with reference to FIG. 17. FIG. 17A shows the structure where the probe 6 and the cantilever 21 are worked by the working process. As shown in FIG. 17B, the ground layer 20 made of a metallic film is formed on both sides of the structure. This ground layer may be formed of copper to a thickness of 5 $\mu$m by means of the sputtering device and the plating device. Then, as shown in FIG. 17C, the insulating film 17 composed of polyimide is formed on the ground layer 20 to have a thickness of 25 $\mu$m. In place of the polyimide, the insulating film 17 is composed of a resin material or silicon oxide by means of the fast sputtering device.

Figure 17D:
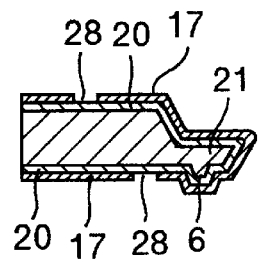
Figure 17D:
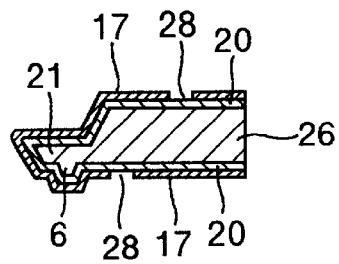
Figure 17E:
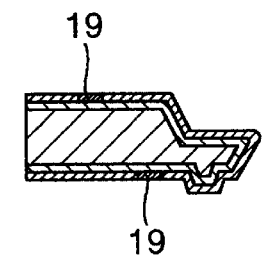
Figure 17E:
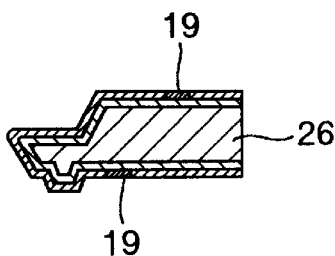
Figure 17F:
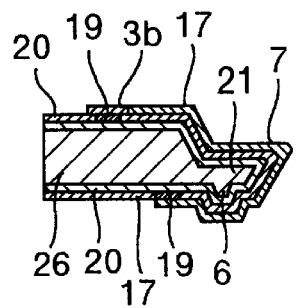
Figure 17F:
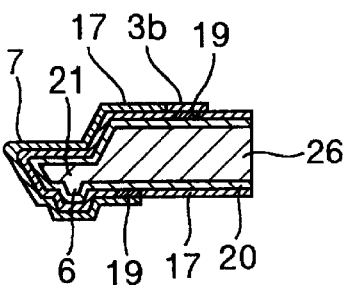

Then, as shown in FIG. 17D, the holes 28 required for enabling connection with the ground layer are formed using the photolithoprocess. As shown in FIG. 17E, the metallic layer 19 is formed on the hole 28 using the lift-off method. As a method for forming the metallic layer, it is possible to form a metal mask on the portion except the holes 28 and a metallic layer through the effect of the sputtering or the evaporation.

Lastly, a film of Cr with a thickness of 20 nm is formed and then a film of Au with a thickness of 1000 nm is formed with a thick film resist by means of the sputtering device and the lift-off method. Then, a film of Cu with a thickness of 10 $\mu$m is formed on the film of Au and then a film of Ni with a thickness of 2 $\mu$m is formed on the film of Au by means of the plating device. The formation of these films results in forming the wire 7 led from the probe 6 to the electrode pad 3b. In place of Cr, a material of Ti may be used. This is because the films of Cr and Ti are formed for improving the adhesion between the ground and the film of Au. The wire material may be any material if it is not soluble at the temperature of 150° C. or higher and may be formed as an electric conductive film. In place of the sputtering device, the devices used for forming the wires may be the vaporing device or the CVD (Chemical vapor Deposition) device. In place of the lift-off method, the method for forming the wires may employ the process of forming a thin film on the overall surface of the substrate by means of the resist such as an electrodeposit resist or a spray resist on which a resist pattern may be formed three-dimensionally, performing the photolithography, etching the substrate for forming the wires, and plating the wires.

Figure 18A:
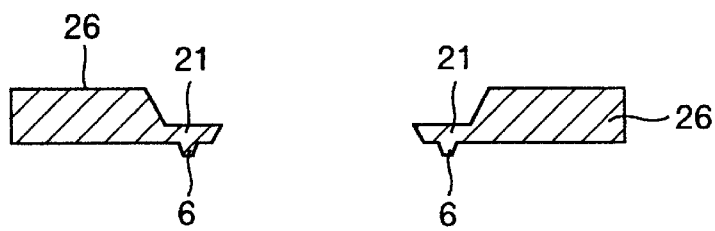
FIGS. 18A–18F are views showing a manufacturing process of a wire according to the embodiment of the present invention.

FIG. 18A shows the structure where the probes 6 and the cantilever 21 are worked by the foregoing working process.

Figure 18B:
Figure 18C:
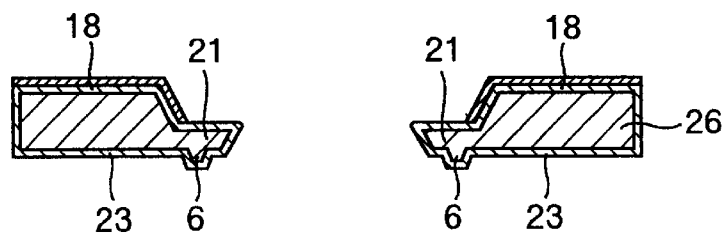

Then, as shown in FIG. 18B, the thermal oxidation film 23 is formed. The silicon wafer used herein has so low a resistance as 0.01 Ωcm. This is because the structure where the silicon wafer is worked is used as a conductor. The thickness of the thermal oxidation film is made to be 3 μm.

Then, the insulating film 18 composed of polyimide is formed on the flat surface and the slope surface as opposed to the probe forming surface so that the film 18 may have a thickness of 22 μm. In this case, the polyimide film may be formed on both of the overall surfaces because of the easiness of the working process. The insulating film 18 may be formed of a resin material except polyimide or silicon oxide using the fast sputtering device.

Figure 18D:
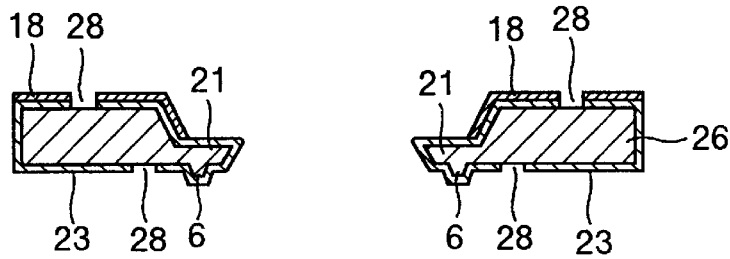
Figure 18E:
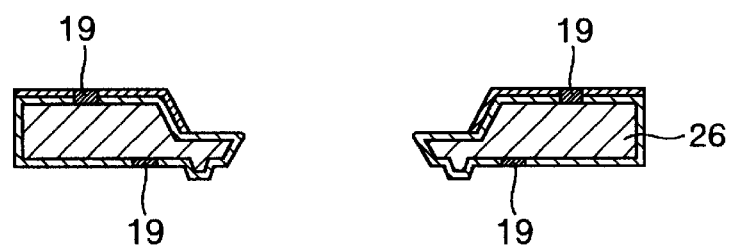

Next, as shown in FIG. 18D, the holes required for conducting with the silicon wafer are formed using the photolithoprocess. As shown in FIG. 18E, the metallic layer 19 is formed on the hole 28 using the lift-off method. Further, the metallic layer may be formed by the sputtering or evaporation after a metal mask is formed on the portion except the hole 28.

Figure 18F:
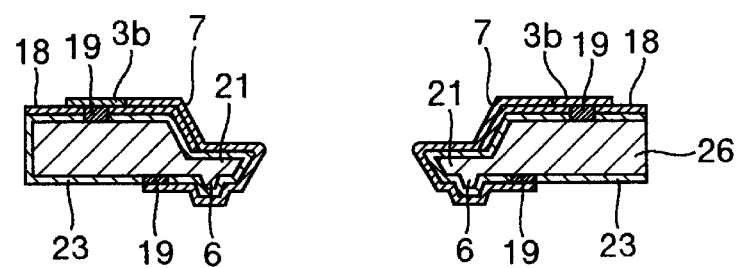

Last, as shown in FIG. 18F, with a thick film resist, a film of Cr is formed to have a thickness of 20 nm and then a film of Au is formed to have a thickness of 1000 nm by means of the sputtering device and the lift-off method. On the film of Au is formed a film of Cu with a thickness of 10 μm. Then, on the film of Cu is formed a film of Ni with a thickness of 2 μm by means of the plating device. The resulting structure is made to have the wire 7 led from the probe 6 to the electrode pad 3b. The wiring material may be any material if it is not soluble at a temperature of 150° C. or higher and may be formed as an electric conductive film. The devices used for forming the wire may be another device rather than the sputtering device, such as the deposition device or the CVD (Chemical Vapor Deposition) device. Further, the method for forming the wire is not limited to the foregoing lift-off method. In place, the wire may be formed by the process of forming a film on the overall surface of the substrate with a resist where the resist pattern is formed three-dimensionally, such as an electrodeposit resist or a spray resist, the photolithography, the etching, and the plating. For working the silicon wafer, the ICP-RIE (Inductively Coupled Plasm-RIE) device for doing the work at a high aspect ratio may be used. The use of the device makes it possible to form the cantilever structured at a high aspect ratio at a narrow pitch. The possible formation of the thick beam leads to a strong beam. By changing the length and the sectional form of the beam, it is possible to freely design the pressure to be applied on the electrode pad of the wafer to-be-tested.

Figure 19:
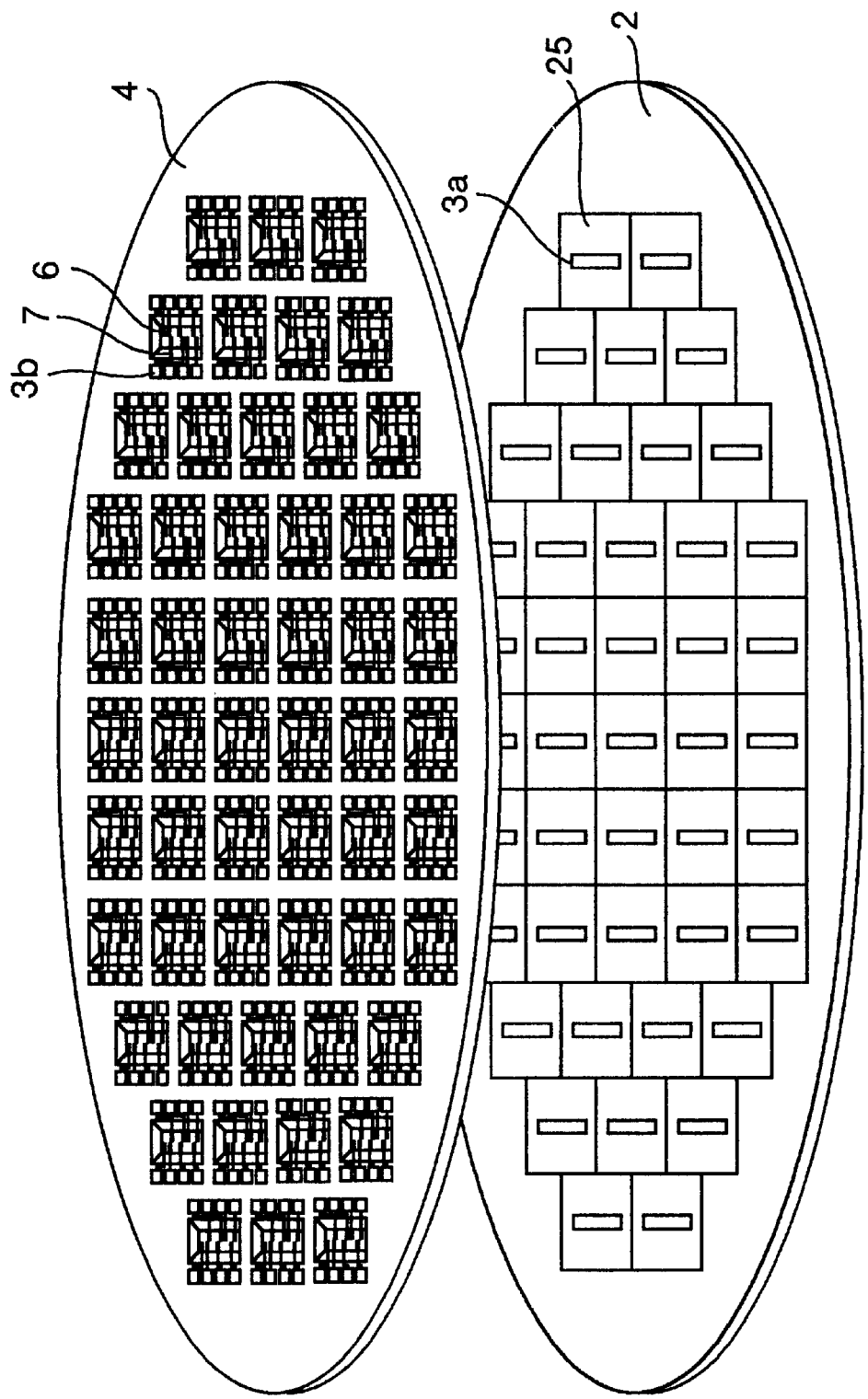
FIG. 19 is a view showing a manufacturing process of a wire according to another embodiment of the present invention.

FIG. 19 shows an appearance view provided if the foregoing structures of the present invention are applied to the probe forming substrate. A plurality of chips 25 are formed on the wafer 2 to be tested in length of 8 inches. On each of the chips is formed a plurality of electrode pads 3a. On the other hand, on the probe forming substrate 4 according to the present invention, the probes are formed at the corresponding positions to the electrode pads formed on the wafer to be tested. Hence, the same number of electrode pads 3b as the probes are formed. Further, the wire 7 is routed from the probe to the electrode pad 3b. By keeping the probe forming substrate 4 in contact with the wafer 2 to be tested, various kinds of tests can be executed over one wafer at a batch.

The application of the probing test, the burn-in test and the final.test to the foregoing wafer batch testing equipment according to the present invention results in making the contact resistance between the electrode pad of the wafer to be test and the probe end terminal as small as 0.1 Ω or less and the test frequency as large as 500 MHz or more. The life of the wafer to be tested is three hundred thousand times or more. Though the atmosphere temperature is changed from a room temperature to 180° C., the excellent contact is held between the electrode of the wafer to be tested and the electrode pad. Further, the data about the defective chip contained in the wafer to be tested at each step is stored. At the next test, the system with no test of the defective chip is employed.

Further, according to the present invention, the probe forming substrate employs a silicon wafer of 8 inches. However, since the probe forming substrate is worked to have the same size as the chip of the wafer to be tested, in place, it is possible to die the wafer of 6 inches and selectively combine the died parts. In this case, if the probe forming substrate is partially broken, the part may be easily exchanged.

According to the present invention, as mentioned above, the same number of structures as the electrode pads of the wafer to be tested are formed. In place, two or more structures may be formed for each electrode pad. In testing the wafer to be tested, if the probe is dead due to its life, two or more structures formed for one electrode pad may be used merely by changing the position.

Moreover, according to the present invention, various kinds of tests are made possible without dieing in the wafer size to be tested. Hence, it is possible provide the probe forming substrate structured to suit to each test specification.

As described above, the test of the fast device is made possible, so that the semiconductor element or the electronic part may be supplied at very low cost even after it is tested.

According to the present invention, the wafer batch testing device provides a function of supplying a wide range of frequencies for testing a device. Hence, the testing device is capable of performing various kinds of tests just in the size of a wafer to be tested. Moreover, the testing device enables to shorten the testing time and is superior in mass productivity and thus provides a highly reliable semiconductor device at low cost.

What is claimed is:

1. A method for manufacturing a semiconductor device utilizing semiconductor testing equipment comprising the steps of:

forming an integrated circuit on a surface of a wafer; and testing electric characteristic of said integrated circuit utilizing the semiconductor testing equipment;

wherein the testing step includes:

a step of positioning each of probes of the semiconductor testing equipment and each of electrodes of a tested semiconductor element with each other; and a step of allowing each of the probes to come into contact with each of said electrodes; and wherein the semiconductor testing equipment includes:

a first substrate having a cantilever;

the probes being formed on the cantilever of the first substrate; and wires for electrically connecting the probes to electrode pads which are formed on an opposite side of the first substrate to a side on which the probes are formed, and each of said wires having a region arranged on an insulating layer, which is formed on a tip surface of the cantilever on the opposite side.

2. A method as claimed in claim 1, wherein on a surface of the first substrate on which the probes are formed, a ground wiring layer composed of metal is formed so as to enclose the first substrate, an insulating layer is formed on the ground wiring layer; and a plurality of wires are formed on the insulating layer.

3. A method as claimed in claim 2, wherein the plurality of wires include a power line, a ground line and signal lines, the power line and the ground line are thicker than each of the signal lines, the power line and the ground line are electrically connected with the ground layer near the electrode pads, and the signal lines are electrically connected with the ground layer near the probes.

4. A method as claimed in claim 2, wherein the thickness of the insulating layer ranges from 3 $\mu$m to 30 $\mu$m.

5. A method as claimed in claim 1, wherein the first substrate is composed of low-resistive silicon, and a plurality of wires are formed on a surface of the first substrate through the insulating layer.

6. A method as claimed in claim 5, wherein the plurality of wires include a power line, a ground line and signal lines, the power line and the ground line are thicker than each of the signal lines; the power line and the ground line are electrically connected with a low resistive silicon layer near the electrode pads; and the signal lines are electrically connected with said low resistive silicon layer near the probes.

7. A method as claimed in claim 6, wherein the insulating layer formed on the first substrate composed of low resistive silicon is formed of a first insulating film and a second insulating film.

8. A method as claimed in claim 7, wherein the first insulating film is formed of thermal oxidation film composed of silicon dioxide, and the second insulating film is formed of polyimide resin.

9. A method as claimed in claim 8, wherein the first insulating film has a thickness of $\mu$m or less, and a thickness of the first and second insulating films ranges from 3 $\mu$m to 30 $\mu$m.

10. A method as claimed in claim 1, wherein the plurality of wires include a power line, a ground line and signal lines, the power line and the ground line are thicker than each of signal lines, the power line and the ground line are electrically connected with a low resistive silicon layer near the electrode pads, and the signal lines are electrically connected with said low resistive silicon layer near the probes.

11. A method as claimed in claim 10, wherein the insulating layer formed on the first substrate composed of low resistive silicon is formed of a first insulating film and a second insulating film.

12. A method as claimed in claim 11, wherein the first insulating film is formed of thermal oxidation film composed of silicon dioxide, and the second insulating film is formed of polyimide resin.

13. A method as claimed in claim 12, wherein the first insulating film has a thickness of 3 $\mu$m or less, and a thickness of the first and second insulating films ranges from 3 $\mu$m to 30 $\mu$m.

14. A method as claimed in claim 1, wherein the wires extend from a portion of the cantilever where the probes are formed over and along the tip surface of the cantilever to the electrode pad formed on the opposite side of the first substrate in an area of the first substrate other than the cantilever.

15. A method as claimed in claim 14, wherein the wires enable electric connection of the probes and electrode pads without passing through a through hole in the first substrate.

16. A method for manufacturing a semiconductor device comprising the steps of:

forming an integrated circuit on a surface of a wafer;

testing electric characteristic of the integrated circuit; and separating the wafer into chips to seal each of the chips by resin or ceramics;

wherein the testing step includes:
 positioning each of probes of a semiconductor testing equipment and each of electrodes of a tested semiconductor element with each other; and
 allowing each of said probes to come into contact with each of the electrodes;

wherein the semiconductor testing equipment includes:
 a first substrate having a cantilever;
 probes formed on the cantilever of the first substrate; and
 wires for electrically connecting the probes to electrode pads which are formed on an opposite side of the first substrate to a side on which the probes are formed, each of the wires having a region arranged on an insulating layer, which is formed on a tip surface of the cantilever on the opposite side.

17. A method as claimed in claim 16, wherein the wires extend from a portion of the cantilever where the probes are formed over and along the tip surface of the cantilever to the electrode pad formed on the opposite side of the first substrate in an area of the first substrate other than the cantilever.

18. A method as claimed in claim 17, wherein the wires enable electric connection of the probes and electrode pads without passing through a through hole in the first substrate.

19. A method for manufacturing a semiconductor device comprising the steps of:

forming an integrated circuit on a surface of a wafer;

testing electric characteristic of the integrated circuit; and separating the wafer into chips to seal each of the chips by resin or ceramics;

wherein the testing step includes:
 positioning each of probes of a semiconductor testing equipment and each of electrodes of a tested semiconductor element with each other; and
 allowing each of the probes to come into contact with each of the electrodes;

wherein the semiconductor testing equipment includes:
 a first substrate having a cantilever;
 probes formed on the cantilever of the first substrate; and
 wires for electrically connecting the probes to electrode pads which are formed on an opposite side of the first substrate to a side on which the probes are formed, each of the wires having a region arranged on an insulating layer, which is formed on a tip surface of the cantilever on the opposite side, the wires extending on the side on which the probes are formed on and over the tip surface of the cantilever onto the opposite side.

20. A method as claimed in claim 19, wherein the wires extend from a portion of the cantilever where the probes are formed over and along the tip surface of the cantilever to the electrode pad formed on the opposite side of the first substrate in an area of the first substrate other than the cantilever.

21. A method as claimed in claim 20, wherein the wires enable electric connection of the probes and electrode pads without passing through a through hole in the first substrate.

* * * * *